(12) United States Patent
Chia et al.

(10) Patent No.: US 11,856,780 B2
(45) Date of Patent: Dec. 26, 2023

(54) GRID STRUCTURE TO REDUCE DOMAIN SIZE IN FERROELECTRIC MEMORY DEVICE

(71) Applicant: Taiwan Semiconductor Manufacturing Company, Ltd., Hsin-Chu (TW)

(72) Inventors: Han-Jong Chia, Hsinchu (TW); Sai-Hooi Yeong, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/868,837

(22) Filed: Jul. 20, 2022

(65) Prior Publication Data
US 2022/0352206 A1 Nov. 3, 2022

Related U.S. Application Data

(62) Division of application No. 16/860,296, filed on Apr. 28, 2020, now Pat. No. 11,508,752.

(60) Provisional application No. 62/948,892, filed on Dec. 17, 2019.

(51) Int. Cl.
*G11C 11/22* (2006.01)
*H10B 51/10* (2023.01)
*H10B 51/30* (2023.01)

(52) U.S. Cl.
CPC ............ *H10B 51/10* (2023.02); *G11C 11/223* (2013.01); *H10B 51/30* (2023.02)

(58) Field of Classification Search
CPC ........ H10B 51/10; H10B 51/30; H10B 53/30; H10B 51/00; G11C 11/223; H01L 29/78391; H01L 29/516
See application file for complete search history.

(56) References Cited

U.S. PATENT DOCUMENTS

| | | | | |
|---|---|---|---|---|
| 5,031,144 A | * | 7/1991 | Persky | G11C 11/22 361/321.1 |
| 2004/0150056 A1 | * | 8/2004 | Yang | H01L 21/76838 257/E21.582 |
| 2006/0054953 A1 | * | 3/2006 | Son | H01L 27/0629 257/296 |
| 2009/0161523 A1 | * | 6/2009 | Tran | G11B 9/02 369/126 |

(Continued)

OTHER PUBLICATIONS

Non-Final Office Action dated Jan. 3, 2022 for U.S. Appl. No. 16/860,296.

(Continued)

*Primary Examiner* — S M Sohel Imtiaz
(74) *Attorney, Agent, or Firm* — Eschweiler & Potashnik, LLC

(57) ABSTRACT

Various embodiments of the present disclosure are directed towards a method for forming an integrated chip, the method includes depositing a grid layer over a substrate. The grid layer is patterned to form a grid structure. The grid structure comprises a plurality of sidewalls defining a plurality of openings. A ferroelectric layer is deposited over the substrate. The ferroelectric layer fills the plurality of openings and is disposed along the plurality of sidewalls of the grid structure. An upper conductive structure is formed over the grid structure.

20 Claims, 11 Drawing Sheets

(56) References Cited

U.S. PATENT DOCUMENTS

| | | | |
|---|---|---|---|
| 2009/0224307 A1* | 9/2009 | Lee | H01L 29/7881 |
| | | | 257/316 |
| 2013/0307104 A1* | 11/2013 | Tsai | H01L 27/14621 |
| | | | 257/E31.128 |
| 2017/0162250 A1* | 6/2017 | Slesazeck | G11C 11/2273 |
| 2018/0024443 A1* | 1/2018 | Wittebrood | G03F 1/70 |
| | | | 430/5 |
| 2018/0114721 A1* | 4/2018 | Mohanty | H01L 23/535 |
| 2019/0019801 A1* | 1/2019 | Yoo | H01L 29/517 |
| 2019/0130956 A1* | 5/2019 | Müller | H01L 29/0673 |
| 2019/0131458 A1* | 5/2019 | Yoo | H10N 70/8836 |
| 2020/0066755 A1* | 2/2020 | Han | G11C 11/22 |
| 2021/0143250 A1* | 5/2021 | Lee | H01L 28/60 |

OTHER PUBLICATIONS

Notice of Allowance dated Jul. 6, 2022 for U.S. Appl. No. 16/860,296.

* cited by examiner

GRID STRUCTURE TO REDUCE DOMAIN SIZE IN FERROELECTRIC MEMORY DEVICE

REFERENCE TO RELATED APPLICATIONS

This Application is a Divisional of U.S. application Ser. No. 16/860,296, filed on Apr. 28, 2020, which claims the benefit of U.S. Provisional Application No. 62/948,892, filed on Dec. 17, 2019. The contents of the above-referenced Patent Applications are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
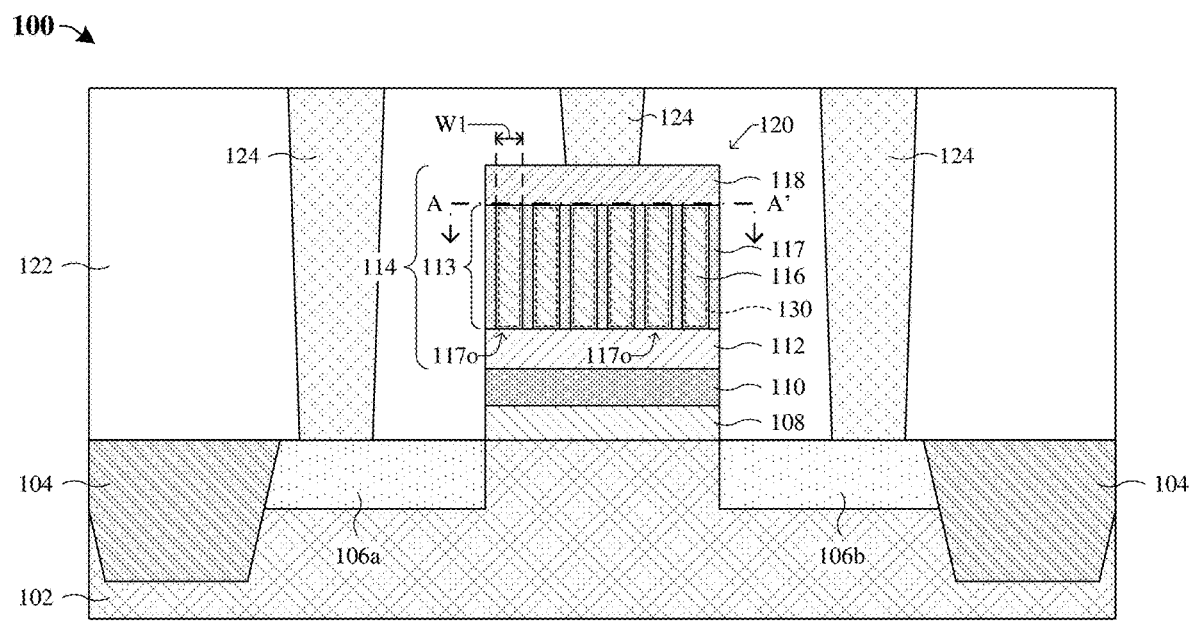
FIGS. 1 and 2A-2B illustrate various views of some embodiments of an integrated chip having a ferroelectric memory device with a ferroelectric structure that includes a ferroelectric layer disposed within a grid structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some ferroelectric memory (e.g., ferroelectric random-access memory (FeRAM)) comprise a ferroelectric memory cell. The ferroelectric memory cell comprises a ferroelectric structure disposed between a first electrode and a second electrode. In other embodiments, the ferroelectric structure may be disposed between a gate electrode and a semiconductor substrate (e.g., ferroelectric field-effect transistor (FeFET)). The ferroelectric structure is configured to switch between a first polarization state (e.g., negative remnant (−Pr) polarization state), which corresponds to a binary value of "1", and a second polarization state (e.g., positive remnant (+Pr) polarization state), which corresponds to a binary value of "0", or vice versa.

The ferroelectric structure includes a plurality of ferroelectric domains distributed throughout the ferroelectric material of the ferroelectric structure. During operation of the ferroelectric memory cell, a positive voltage pulse is applied to the first electrode to switch the ferroelectric structure to the first polarization state, and a negative voltage pulse is applied to the first electrode to switch the ferroelectric structure to the second polarization state, or vice versa. While applying the positive or negative voltage pulses, a polarization of each individual ferroelectric domain will rotate to align itself in a same direction that corresponds to the direction of the voltage pulse. For example, while applying the positive voltage pulse each ferroelectric domain may be set to a negative polarization state, and while applying the negative voltage pulse each ferroelectric domain may be set to a positive polarization state, or vice versa. As the plurality of ferroelectric domains are set to a same polarization state, the ferroelectric structure will have a polarization state that corresponds to the plurality of ferroelectric domains.

A challenge with the above ferroelectric structure is a variation in grain sizes and/or a variation in size of the ferroelectric domains across the ferroelectric material. The size of the ferroelectric domains may affect a voltage required to set the polarization of each ferroelectric domain. Further, the ferroelectric domain size correlates to a corresponding grain size, such that the grain size may affect the voltage required to set the polarization of each ferroelectric domain. Further, the overall polarization of the ferroelectric structure corresponds to the summation of the polarization of each ferroelectric domain. For example, a first ferroelectric domain may have a first size and an adjacent second ferroelectric domain may have a second size different from the first size. Due to the difference between the first and second sizes, the first ferroelectric domain may have a first coercive field and the second ferroelectric domain may have a second coercive field different from the first coercive field. This may result in the first ferroelectric domain switching polarization at a first voltage, while the second ferroelectric domain switches polarization at a second voltage different from the first voltage. Thus, an absolute value of a voltage applied to the first electrode may be increased to ensure each ferroelectric domain in the ferroelectric material switches polarization, and/or a duration of an applied voltage pulse may be increased to facilitate complete switching of each ferroelectric domain. This may increase a power consumption of the ferroelectric memory cell, reduce endurance of the ferroelectric memory cell, and/or reduce discrete data states of the ferroelectric memory cell.

Additionally, in a memory array including a plurality of ferroelectric memory cells, the variation in grain size and/or ferroelectric domain size across the ferroelectric structures may result in bit to bit variation between adjacent ferroelectric memory cells (e.g., a variation in set and/or reset voltages across the memory array is greater than about ten percent). This in turn may reduce performance of the memory array. Furthermore, tuning of grain sizes and/or ferroelectric domain sizes may include changing interfacial materials in contact with the ferroelectric structure, adjusting a doping type and/or concentration of the ferroelectric material, and/or adjusting an annealing process (e.g., changing the time and temperature of the annealing process) performed on the ferroelectric structure. However, the aforementioned tuning processes may not accurately decrease and/or restrict the ferroelectric domain size, such that a bit to bit variation may still occur across the memory array.

Accordingly, various embodiments of the present disclosure relate to a ferroelectric memory cell having a ferroelectric structure with ferroelectric domains that are relatively small and/or uniform. In some embodiments, the ferroelectric memory device includes a first electrode, a second electrode, and a ferroelectric structure disposed between the first and second electrodes. The ferroelectric structure includes a ferroelectric layer and a grid structure. The grid structure comprises a plurality of sidewalls defining openings within the grid structure. The ferroelectric layer is disposed within the grid structure such that it fills the openings and contacts the plurality of sidewalls. The grid structure is configured to reduce the size of the ferroelectric domains in the ferroelectric layer, thereby decreasing power consumption of the ferroelectric memory cell, and increasing endurance and discrete data states of the ferroelectric memory cell.

For example, the length and width of each opening defined by the sidewalls of the grid structure may be relatively small (e.g., the length and width may respectively be about 20 nanometers or less). This may constrict the size of each ferroelectric domain and facilitate each ferroelectric domain having approximately the same size. The uniformity of size of the ferroelectric domains across the ferroelectric structure facilitates each ferroelectric domain switching polarization at approximately the same voltage. Further, in a memory array including a plurality of ferroelectric memory cells, each having a ferroelectric structure with the grid structure and ferroelectric layer, the uniformity of ferroelectric domain sizes decreases bit to bit variation across the memory array (e.g., a variation in set and/or reset voltages across the memory array is less than about one percent). This increases performance of the memory array.

Figure 2A:
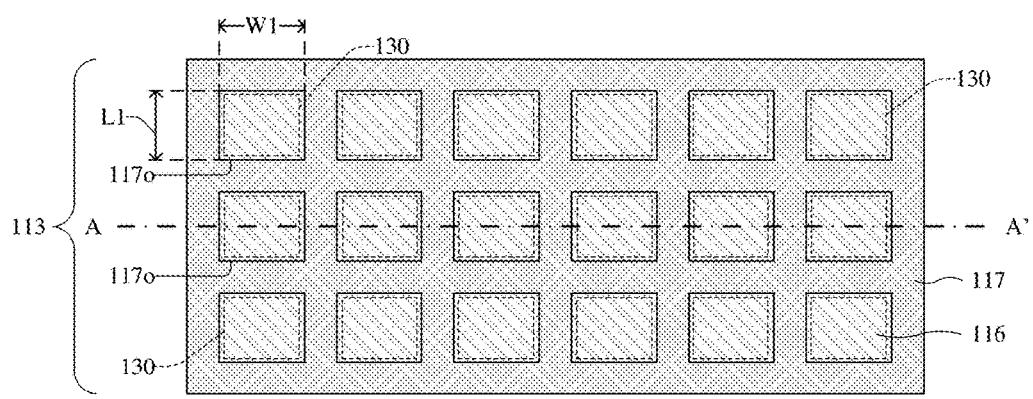
Figure 2B:
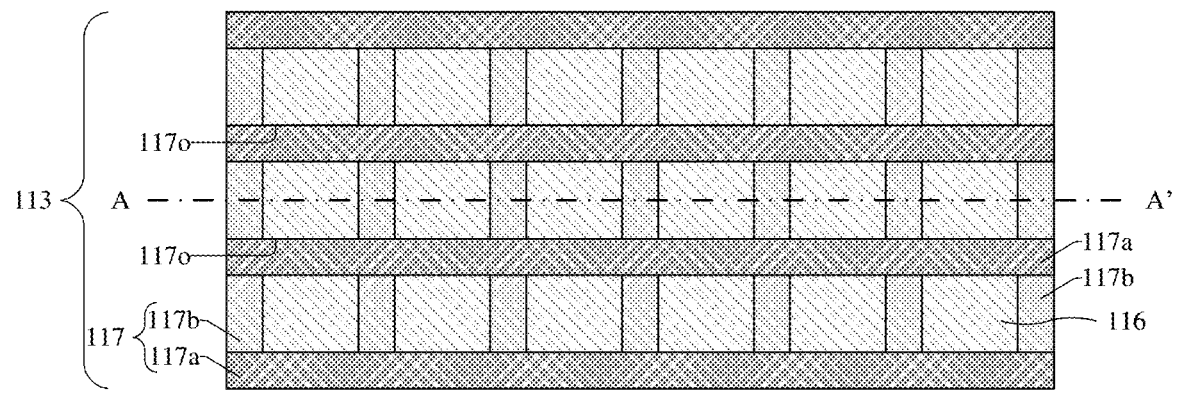

FIGS. 1 and 2A-2B illustrate various views of some embodiments of an integrated chip 100 including a ferroelectric memory device 114 with a ferroelectric structure 113, where the ferroelectric structure 113 includes a ferroelectric layer 116 disposed within a grid structure 117. FIG. 1 illustrates some embodiments of a cross-sectional view of the integrated chip 100, and FIGS. 2A-2B illustrate some alternative embodiments of a top view of the ferroelectric structure 113 taken along the line A-A'. The ferroelectric memory device 114 may, for example, be part of a random-access memory (RAM) device (e.g., ferroelectric random-access memory (FeRAM) device) and/or could be realized in a fin type design (e.g., finFET type design). Further, the ferroelectric memory device 114 may be referred to as a front-end-of-line ferroelectric memory device. It will be appreciated that, in other embodiments, the ferroelectric memory device 114 may be configured for middle-end-of-line ferroelectric memory devices and/or back-end-of-line ferroelectric memory devices (not shown) (e.g., see FIGS. 3 and/or 5).

The integrated chip 100 includes an inter-level dielectric (ILD) structure 122 overlying a substrate 102. An isolation structure 104 is disposed within the substrate 102. A pair of source/drain regions 106a-b are disposed in the substrate 102 and are spaced apart from one another. A device gate stack 120 overlies the substrate 102 and is spaced between the source/drain regions 106a-b. A plurality of conductive contacts 124 are disposed in the ILD structure 122. The conductive contacts 124 extend through the ILD structure 122 to contact the source/drain regions 106a-b and the device gate stack 120, respectively.

In some embodiments, the device gate stack 120 comprises a gate dielectric layer 108 disposed along the substrate 102, a gate electrode 110 overlying the gate dielectric layer 108, and the ferroelectric memory device 114. The ferroelectric memory device 114 overlies the gate electrode 110. In addition, in some embodiments, the ferroelectric memory device 114 comprises a first conductive structure 112, a second conductive structure 118, and the ferroelectric structure 113 disposed between the first and second conductive structures 112, 118. In some embodiments, the ferroelectric memory device 114 may be referred to as a polarization switching structure. Further, the ferroelectric memory device 114 is configured to store a bit of data. For example, the ferroelectric memory device 114 may switch between a first polarization state (e.g., negative remnant (−Pr) polarization state), which corresponds to a binary value of "1", and a second polarization state (e.g., positive remnant (+Pr) polarization state), which corresponds to a binary value of "0", or vice versa. In some embodiments, a positive voltage pulse is applied to the second conductive structure 118 to switch to the first polarization state, and a negative voltage pulse is applied to the second conductive structure 118 to switch to the second polarization state, or vice versa. In some embodiments, the first and second conductive structures 112, 118 may, for example, respectively be or comprise tungsten, ruthenium, titanium nitride, tantalum nitride, another suitable conductive material, or any combination of the foregoing.

In further embodiments, the ferroelectric layer 116 may, for example, be or comprise a metal-oxide (e.g., hafnium oxide ($Hf_xO_Y$)), a component-metal-oxide (e.g., hafnium-silicon-oxide ($Hf_xSi_YO_Z$), hafnium-aluminum-oxide ($Hf_xAl_YO_Z$), hafnium-gadolinium-oxide ($Hf_xGd_YO_Z$), hafnium-zirconium-oxide ($Hf_xZr_YO_Z$), hafnium-lanthanum-oxide ($Hf_xLa_YO_Z$), hafnium-strontium-oxide ($Hf_xSr_YO_Z$), hafnium-yttrium-oxide ($Hf_xY_YO_Z$), etc.), a metal-oxynitride (e.g., hafnium oxynitride ($Hf_xO_YN_Z$)), or the like. In yet further embodiments, the grid structure 117 may, for example, be or comprise silicon dioxide, tetra-ethyl-orthosilicate (TEOS), silicon oxynitride, silicon oxycarbide, silicon nitride, another dielectric material, or any combination of the foregoing. The ferroelectric memory device 114 may be disposed within a memory array comprising a plurality of rows and columns of individual ferroelectric memory devices 114.

The ferroelectric layer 116 comprises a plurality of ferroelectric domains 130 (e.g., represented by a dashed box) distributed across the ferroelectric structure 113. A size of the ferroelectric domains 130 may affect a resistance of the ferroelectric structure 113, a set voltage of the ferroelectric structure 113, a reset voltage of the ferroelectric structure 113, and/or another parameter of the ferroelectric structure 113. Thus, in some embodiments, a variation and/or increase in size of the ferroelectric domains 130 in each ferroelectric layer 116 across the memory array may result in a variation of resistance, set voltage, and/or reset voltage between adjacent ferroelectric memory devices in the memory array. This may reduce device performance and/or result in improper bit values in the memory array.

Accordingly, in some embodiments according to the present disclosure, the grid structure 117 is configured to reduce a size of the ferroelectric domains 130 in the ferroelectric layer 116. For example, during fabrication of the ferroelectric memory device 114, the grid structure 117 is formed such that it comprises a plurality of sidewalls defining a plurality of openings 117o. The openings 117o are formed such that they respectively have a relatively small width W1 and a relatively small length L1 (e.g., each less than or equal to about 20 nanometers) (see, e.g., FIGS. 2A-2B). Subsequently, the ferroelectric layer 116 is subsequently formed between the sidewalls of the grid structure 117, thereby filling the openings 117o. By virtue of the openings 117o having the relatively small width W1 and length L1, a size of each ferroelectric domain 130 is restricted to the relatively small width W1 and the relatively small length L1. Further, this ensures that each ferroelectric domain 130 comprises approximately a same size. Thus, because the layout of the grid structure 117 restricts and/or defines the size of the ferroelectric domains 130, adjacent ferroelectric domains 130 may have a same set voltage and/or reset voltage. This, in part, decreases a power consumption of the ferroelectric memory device 114, and increases endurance and reliability of the ferroelectric memory device 114. Further, restricting and/or defining the size of the ferroelectric domains 130 decreases bit to bit variation in a memory array comprising an array of ferroelectric memory device 114.

Further, during operation of the ferroelectric memory device 114, a positive voltage pulse is applied to the second conductive structure 118 to switch the ferroelectric structure 113 to the first polarization state, and a negative voltage pulse is applied to the second conductive structure 118 to switch the ferroelectric structure 113 to the second polarization state, or vice versa. While applying the positive or negative voltage pulses, a polarization of each ferroelectric domain 130 may be orientated in a same manner, thereby setting a polarization state of the ferroelectric structure 113. By virtue of the grid structure 117 restricting the length L1 and the width W1 of each ferroelectric domain 130 to relatively small values, the polarization of each ferroelectric domain 130 may be set at approximately a same voltage value and/or a same duration of the positive or negative voltage pulse. In some embodiments, when the ferroelectric memory device 114 is disposed in a memory array of ferroelectric memory devices, the relatively small size of each ferroelectric domain 130 decreases bit to bit variation across the memory array (e.g., a variation in set and/or reset voltages across the memory array is less than about one percent), thereby increasing performance of the memory array.

In addition, the ferroelectric layer 116 comprises a plurality of grains. By restricting the size of the ferroelectric domains 130, a grain size of the plurality of grains is restricted as well. This decreases a variation of resistance, set voltage, and/or reset voltage between adjacent ferroelectric memory devices in the memory array. In various embodiments, the plurality of grains of the ferroelectric layer 116 may be columnar grains each with a relatively small size (e.g., a length and/or width respectively less than about 30 nanometers or within a range of about 15 to 30 nanometers).

With reference to FIGS. 1 and 2A-2B, each ferroelectric domain 130 comprises the length L1 and the width W1. In some embodiments, the length L1 and the width W1 are respectively less than about 20 nanometers, within a range of about 1-20 nanometers, or another suitable value. This, in some embodiments, may ensure that a single ferroelectric domain is disposed within each opening 117o of the grid structure 117, thereby increasing a uniformity in size of the ferroelectric domains 130 across the ferroelectric layer 116. In further embodiments, if the length L1 and/or the width W1 are relatively large (e.g., greater than about 20 nanometers each), then two or more ferroelectric domains may be disposed within each opening 117o, thereby resulting in a variation of sizes in the ferroelectric domains 130 across the ferroelectric layer 116. As illustrated in the top view of FIG. 2A the grid structure 117 continuously laterally wraps around the ferroelectric domains 130 of the ferroelectric layer 116.

As illustrated in the top view of FIG. 2B, the grid structure 117 comprises a plurality of elongated grid segments 117a extending laterally in a first direction and a plurality of short grid segments 117b extending laterally in a second direction that is substantially orthogonal to the first direction. The short grid segments 117b continuously extend between adjacent pairs of the elongated grid segments 117a. In further embodiments, the grid structure 117 is a single continuous material, such that the elongated grid segments 117a and the short grid segments 117b comprise the single continuous material. Thus, the difference in shading between the elongated grid segments 117a and the short grid segments 117b is provided for ease of illustration. Further, the ferroelectric layer 116 continuously laterally extends between adjacent pairs of the elongated grid segments 117a.

Figure 3:
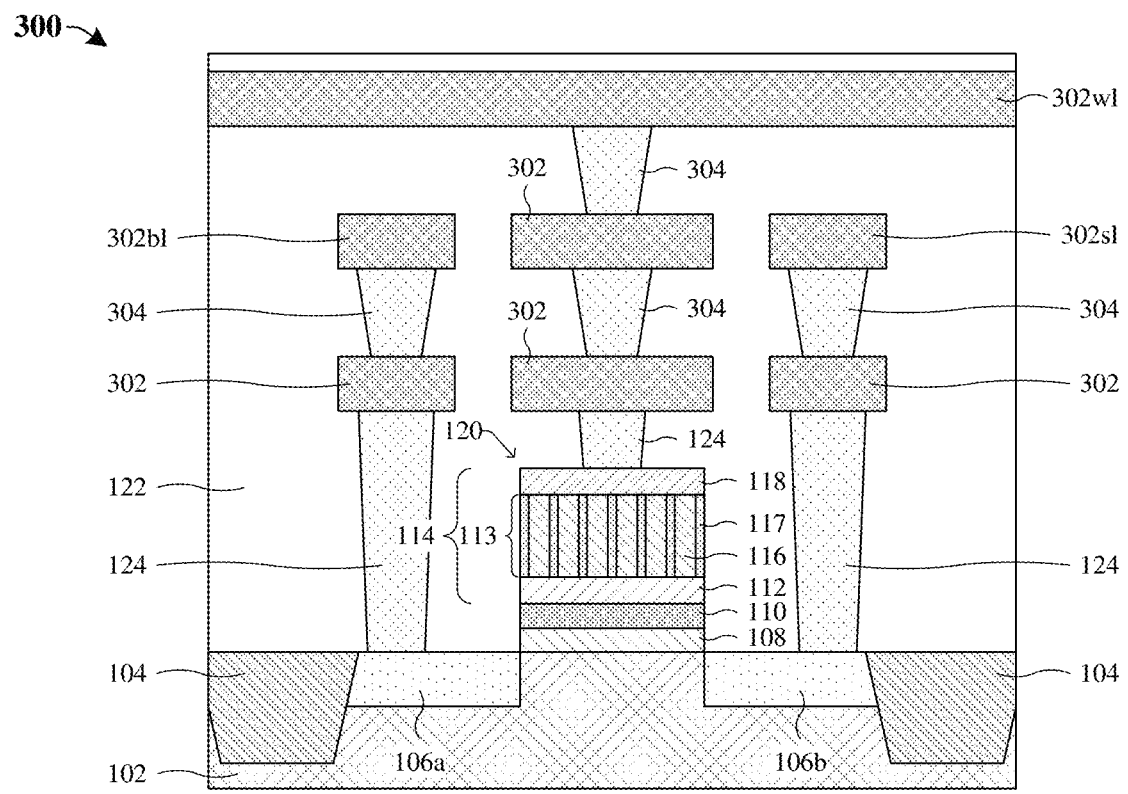
FIGS. 3-4 illustrate cross-sectional views of some alternative embodiments of the integrated chip of FIG. 1.

FIG. 3 illustrates a cross-sectional view of some embodiments of an integrated chip 300 according to some alternative embodiments of the integrated chip 100 of FIG. 1.

As shown in FIG. 3, a plurality of conductive lines 302 (e.g., metal lines) and a plurality of conductive vias 304 (e.g., metal vias) are disposed in the ILD structure 122. The plurality of conductive lines 302, the plurality of conductive vias 304, and the plurality of conductive contacts 124 are electrically coupled together in a predefined manner and configured to provide electrical connections between various devices disposed throughout the integrated chip 300. In some embodiments, the plurality of conductive lines 302 and the plurality of conductive vias 304 may, for example, be or comprise copper, aluminum, titanium nitride, tantalum nitride, ruthenium, tungsten, another conductive material, or any combination of the foregoing. In further embodiments, the conductive contacts 124 may, for example, be or comprise tungsten, copper, aluminum, another conductive material, or the like. It will be appreciated that any number of conductive lines 302 and/or conductive vias 304 may be alternately stacked over one another in the ILD structure 122. In yet further embodiments, the plurality of conductive contacts 124, the plurality of conductive lines 302, the plurality of conductive vias 304, and the ILD structure 122 may be referred to as an interconnect structure.

A first one of the plurality of conductive lines 302 is denoted as 302$w$1 and may be referred to as a word line. In some embodiments, the word line may be electrically coupled to the ferroelectric structure 113 via the interconnect structure and the second conductive structure 118. A second one of the plurality of conductive lines 302 is denoted as 302$b$1 and may be referred to as a bit line. In further embodiments, the bit line may be electrically coupled to a first source/drain region 106$a$ of the source/drain regions 106$a$-$b$ via the interconnect structure. A third one of the plurality of conductive lines 302 is denoted as 302$s$1 and may be referred to as a source line. In yet further embodiments, the source line may be electrically coupled to a second source/drain region 106$b$ of the source/drain regions 106$a$-$b$ via the interconnect structure.

In some embodiments, by providing suitable bias conditions (e.g., a positive voltage pulse, a negative voltage pulse, etc.) to the word line 302$w$1, the bit line 302$b$1, and/or the source line 302$s$1, the ferroelectric structure 113 can be switched between two data states. In some embodiments, the ferroelectric memory device 114, the gate electrode 110, the gate dielectric layer 108, and the source/drain regions 106$a$-$b$ may be configured as a metal-ferroelectric-metal-insulator-semiconductor field-effect transistor (MFMIS-FET) device.

In some embodiments, the substrate 102 may comprise any type of semiconductor body (e.g., monocrystalline silicon/CMOS bulk, silicon-germanium (SiGe), silicon on insulator (SOI), etc.). The isolation structure 104 may, for example, be a shallow trench isolation (STI) structure, a deep trench isolation (DTI) structure, another suitable isolation structure, or the like. In further embodiments, the source/drain regions 106$a$-$b$ are doped regions of the substrate 102 that have a doping type (e.g., n-type or p-type) opposite that of adjoining regions of the substrate 102, or the adjoining regions of the substrate 102 may be intrinsic. The ILD structure 122 may comprise one or more stacked ILD layers, which may respectively comprise a low-k dielectric (e.g., a dielectric material with a dielectric constant less than about 3.9), an oxide (e.g., silicon dioxide), another suitable dielectric material, or the like.

Figure 4:
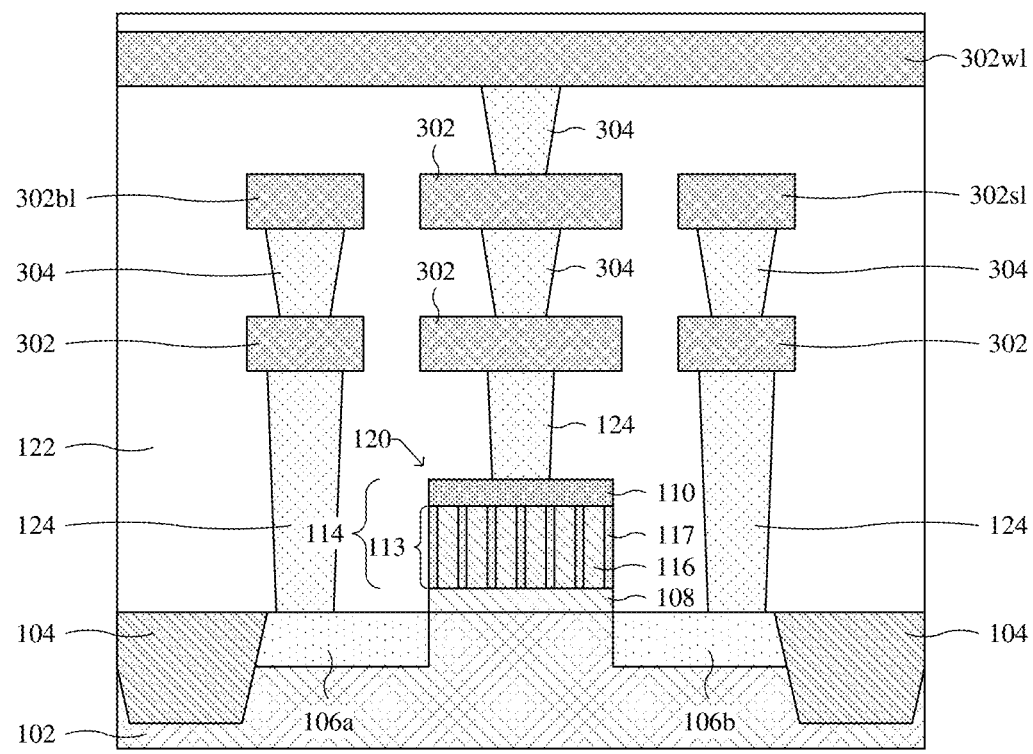

FIG. 4 illustrates a cross-sectional view of some embodiments of an integrated chip 400 according to some alternative embodiments of the integrated chip 300 of FIG. 3, in which the first and second conductive structures 112, 118 are omitted. Further, the ferroelectric structure 113 is disposed between the gate electrode 110 and the gate dielectric layer 108. In such embodiments, the gate electrode 110, the ferroelectric structure 113, the gate dielectric layer 108, and the source/drain regions 106$a$-$b$ may be configured as a metal-ferroelectric-insulator-semiconductor field-effect transistor (MFIS-FET or FeFET). In further embodiments, the ferroelectric layer 116 and the grid structure 117 respectively directly contact the gate electrode 110 and the gate dielectric layer 108.

Figure 5:
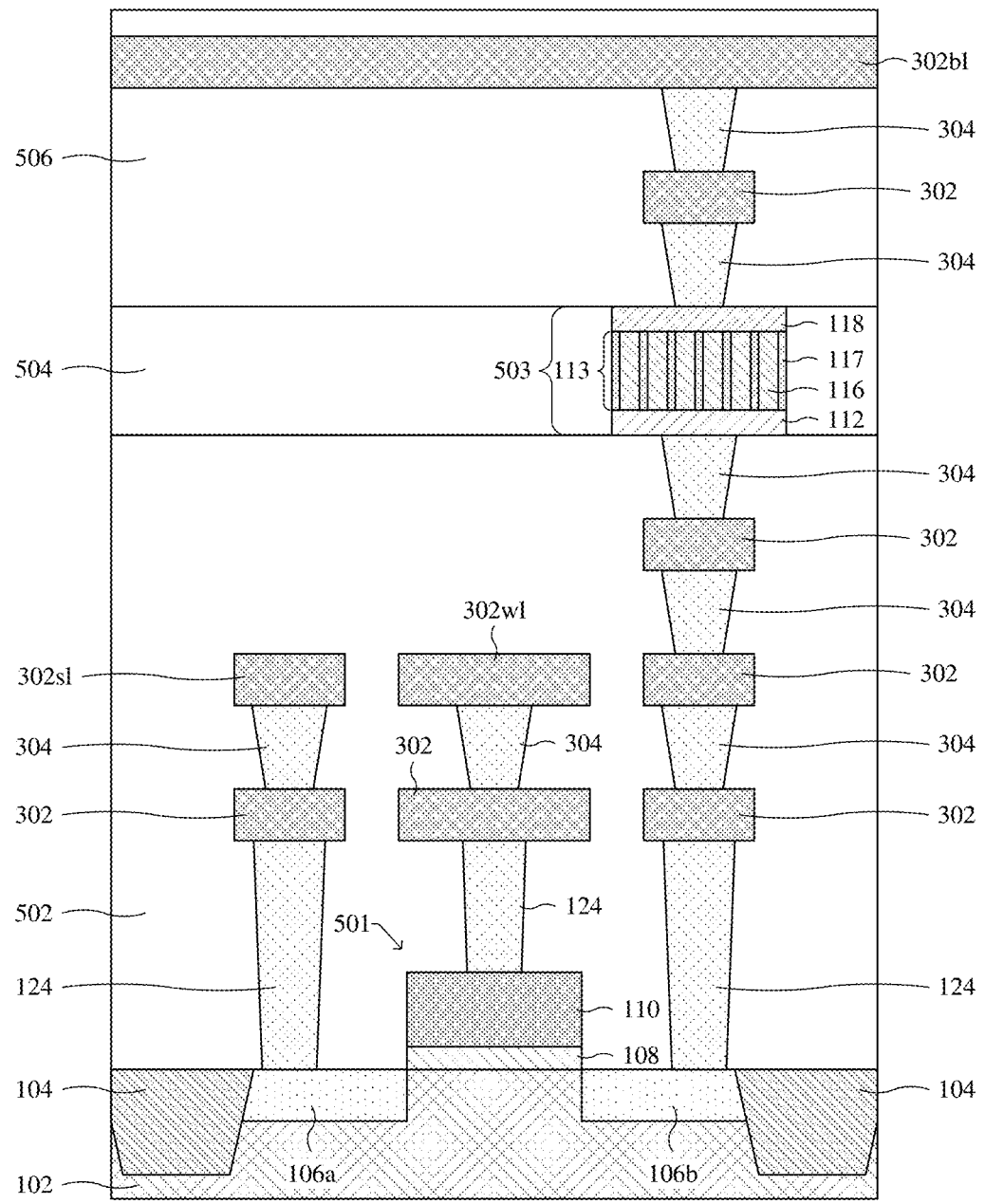
FIG. 5 illustrates a cross-sectional view of some embodiments of an integrated chip having a ferroelectric memory device that includes a ferroelectric layer disposed within a grid structure.

FIG. 5 illustrates a cross-sectional view of some embodiments of an integrated chip 500 having an upper ferroelectric memory device 503 with a ferroelectric structure 113 that includes a ferroelectric layer 116 disposed within a grid structure 117. In some embodiments, the upper ferroelectric memory device 503 may be referred to as a back-end-of-line ferroelectric memory device. In further embodiments, the upper ferroelectric memory device 503 may be part of a RAM device (e.g., FeRAM device). It will be appreciated that, in some embodiments, features of the integrated chip 500 that share a reference number with features of the integrated chip 300 of FIG. 3 may have substantially similar properties (e.g., dimensions, chemical compositions, relationships, etc.) as the features of the integrated chip 300 of FIG. 3 in which they share a reference number. It will further be appreciated that, in some embodiments, the integrated chip 500 may comprise a plurality of the upper ferroelectric memory device 503 disposed in a memory array. In some embodiments, the upper ferroelectric memory device 503 may be referred to as a polarization switching structure.

As shown in FIG. 5, a semiconductor device 501 is disposed on the substrate 102. In some embodiments, the semiconductor device 501 may be a metal-oxide semiconductor field-effect transistor (MOSFET), bipolar junction transistor (BJT), high-electric-mobility transistor (HEMT), or any other front-end-of-line semiconductor device. In further embodiments, the semiconductor device 501 may comprise a gate dielectric layer 108, a gate electrode 110 overlying the gate dielectric layer 108, and a pair of source/drain regions 106$a$-$b$.

A lower ILD structure 502 overlies the substrate 102 and the semiconductor device 501. In some embodiments, a plurality of conductive contacts 124, a plurality of conductive lines 302, and a plurality of conductive vias 304 are disposed in the lower ILD structure 502. An upper ILD structure 506 overlies the lower ILD structure 502. In further embodiments, the conductive lines 302 and the conductive vias 304 are disposed within the upper ILD structure 506. A middle ILD structure 504 is disposed between the upper ILD structure 506 and the lower ILD structure 502. In yet further embodiments, the lower ILD structure 502, the middle ILD structure 504, and the upper ILD structure 506 may comprise one or more stacked ILD layers, which may respectively comprise a low-k dielectric (e.g., a dielectric material with a dielectric constant less than about 3.9), an oxide (e.g., silicon dioxide), another suitable dielectric material, or the like.

In some embodiments, the upper ferroelectric memory device 503 is disposed in the middle ILD structure 504. The upper ferroelectric memory device 503 includes a first conductive structure 112, a second conductive structure 118, and a ferroelectric structure 113 disposed between the first and second conductive structures 112, 118. Further, in some embodiments, the ferroelectric structure 113 comprises a grid structure 117 and a ferroelectric layer 116. In some embodiments, an upper surface of the second conductive structure 118 is substantially co-planar with an upper surface of the middle ILD structure 504. In further embodiments, a lower surface of the first conductive structure 112 is substantially co-planar with a lower surface of the middle ILD structure 504.

In some embodiments, the ferroelectric structure 113 is electrically coupled to the second source/drain region 106$b$ of the semiconductor device 501 via the plurality of conductive lines 302, the plurality of conductive vias 304, and the plurality of conductive contacts 124 disposed in the lower ILD structure 502. Thus, in some embodiments, application of a suitable word line (WL) voltage to the word line 302$w$1 may electrically couple the upper ferroelectric memory device 503 between the bit line 302$b$1 and the source line 302$s$1. Consequently, by providing suitable bias conditions (e.g., a positive voltage pulse, a negative voltage pulse, etc.) the ferroelectric structure 113 can be switched between two data states.

In some embodiments, the upper ferroelectric memory device 503, the semiconductor device 501, and electrical interconnections between the upper ferroelectric memory device 503 and the semiconductor device 501 define a first one-transistor one-capacitor (1T1C) FeRAM memory cell. Note that the electrical interconnects between the upper ferroelectric memory device 503 and the semiconductor device 501 are defined by the conductive lines 302, conductive vias 304, and the conductive contacts 124. In such embodiments, the upper ferroelectric memory device 503 is configured as a capacitor configured to store varying levels of charge which correspond to an individual bit of data stored in the capacitor, and the semiconductor device 501 facilitates access to the upper ferroelectric memory device 503 for read and write operations. In some embodiments, the first 1T1C FeRAM memory cell is one of many 1T1C FeRAM memory cells arranged in rows and columns to define a memory array. In such embodiments, due to the grid structure 117 restricting a size of ferroelectric domains in the ferroelectric layer 116, a variation in charge across the memory array for a same data state is less than about one percent.

FIGS. 6-12 illustrate various views 600-1200 of some embodiments of a method of forming an integrated chip with a ferroelectric memory device comprising a ferroelectric structure that includes a ferroelectric layer disposed within a grid structure according to aspects of the present disclosure. Although the various views 600-1200 shown in FIGS. 6-12 are described with reference to a method, it will be appreciated that the structures shown in FIGS. 6-12 are not limited to the method but rather may stand alone separate of the method. Furthermore, although FIGS. 6-12 are described as a series of acts, it will be appreciated that these acts are not limiting in that the order of the acts can be altered in other embodiments, some acts that are illustrated and/or described may be omitted in whole or in part.

Figure 6:
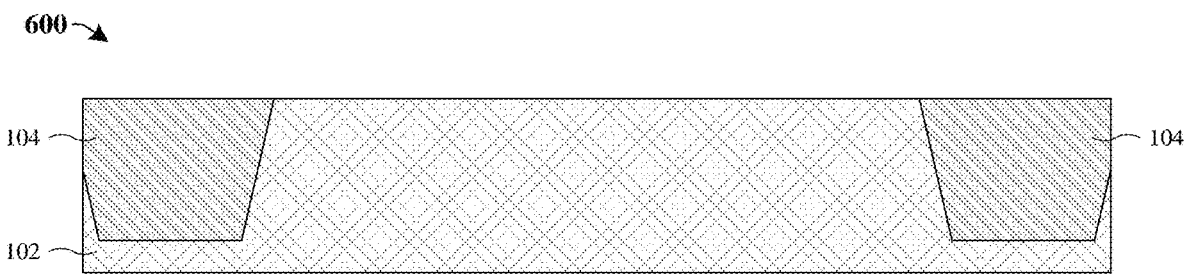
FIGS. 6-12 illustrate a series of various views of some embodiments of a method for forming an integrated chip having a ferroelectric memory device with a ferroelectric structure that includes a ferroelectric layer disposed within a grid structure.

As illustrated in the cross-sectional view 600 of FIG. 6, an isolation structure 104 is formed within a substrate 102. In some embodiments, the isolation structure 104 may be formed by selectively etching the substrate 102 to form a trench in the substrate 102, and subsequently filing (e.g., by chemical vapor deposition (CVD), physical vapor deposition (PVD), atomic layer deposition (ALD), or another suitable deposition or growth process) the trench with a dielectric material. In further embodiments, the substrate 102 is selectively etched by forming a masking layer (not shown) over the substrate 102, and subsequently exposing the substrate 102 to one or more etchants configured to selectively remove unmasked portions of the substrate 102. In yet further embodiments, the dielectric material may, for example, be or comprise an oxide (e.g., silicon dioxide), a nitride (e.g., silicon nitride), a carbide (e.g., silicon carbide), another suitable dielectric material, or any combination of the foregoing.

Figure 7:
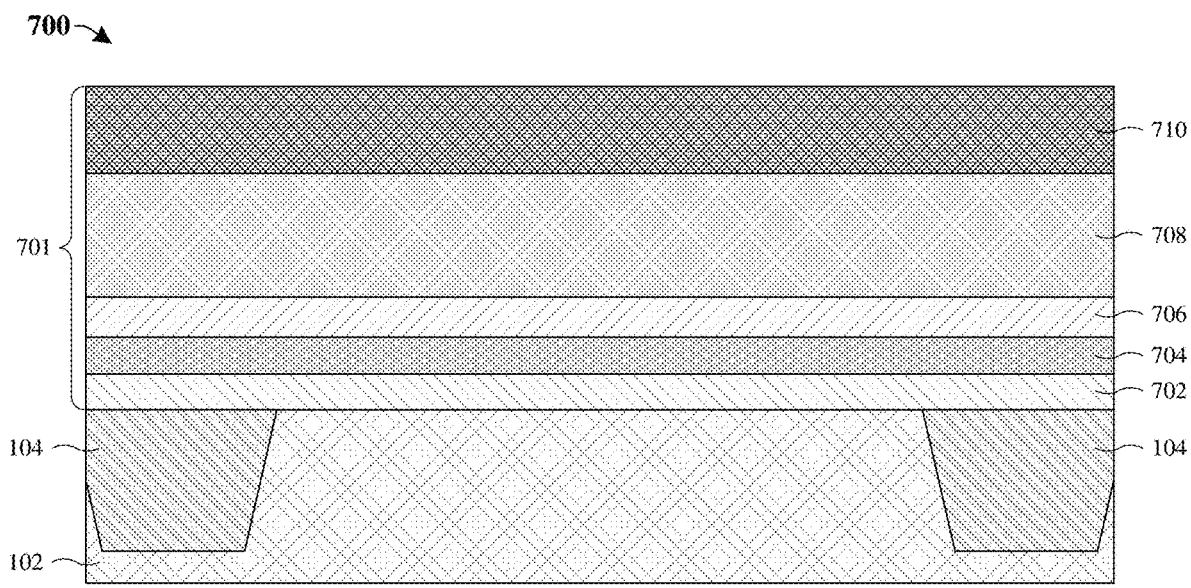

As illustrated in the cross-sectional view 700 of FIG. 7, a stack of layers 701 is formed over the substrate 102. In some embodiments, the stack of layers 701 includes a gate dielectric film 702, a gate electrode layer 704, a first conductive film 706, a grid layer 708, and a masking layer 710. In further embodiments, forming the stack of layers 701 includes performing one or more deposition and/or growth processes to define the gate dielectric film 702, the gate electrode layer 704, the first conductive film 706, the grid layer 708, and the masking layer 710. In yet further embodiments, the one or more deposition and/or growth processes may, for example, include CVD, PVD, ALD, sputtering, electroless plating, electroplating, another suitable deposition or growth process, or any combination of the foregoing. For example, forming the stack of layers 701 may include: depositing the gate dielectric film 702 over the substrate 102, depositing the gate electrode layer 704 over the gate dielectric film 702, depositing the first conductive film 706 over the gate electrode layer 704, depositing the grid layer 708 over the first conductive film 706, and depositing the masking layer 710 over the grid layer 708.

In some embodiments, the gate dielectric film 702 may, for example, be or comprise an oxide (e.g., silicon dioxide), a high-k dielectric material (e.g., $HfO_2$, $ZrO_2$, or some other dielectric material with a dielectric constant greater than about 3.9), some other dielectric material, or any combination of the foregoing. In further embodiments, the gate electrode layer 704 and/or the first conductive film 706 may, for example, respectively be or comprise a metal (e.g., aluminum, titanium, tantalum, gold, platinum, tungsten, nickel, iridium, etc.), a metal-nitride (e.g., titanium nitride, tantalum nitride, etc.), a metal-oxide (e.g., iridium oxide), doped polysilicon (e.g., n-type/p-type polysilicon), another suitable conductive material, or any combination of the foregoing. In yet further embodiments, the grid layer 708 may, for example, be or comprise an oxide, such as silicon dioxide, tetra-ethyl-ortho-silicate (TEOS), silicon oxynitride, silicon oxycarbide, silicon nitride, another suitable dielectric material, or the like. In further embodiments, the masking layer 710 may, for example, include a positive photoresist, a negative photoresist, a hardmask, a stack of masking layer, another suitable masking layer, or any combination of the foregoing.

With reference to FIGS. 8A-8B through 10A-10B, figures with a suffix of "A" illustrate a cross-sectional view of the integrated chip during various formation processes, and figures with a suffix of "B" illustrate a top view taken along the line B-B' of FIGS. with a suffix of "A".

Figure 8A:
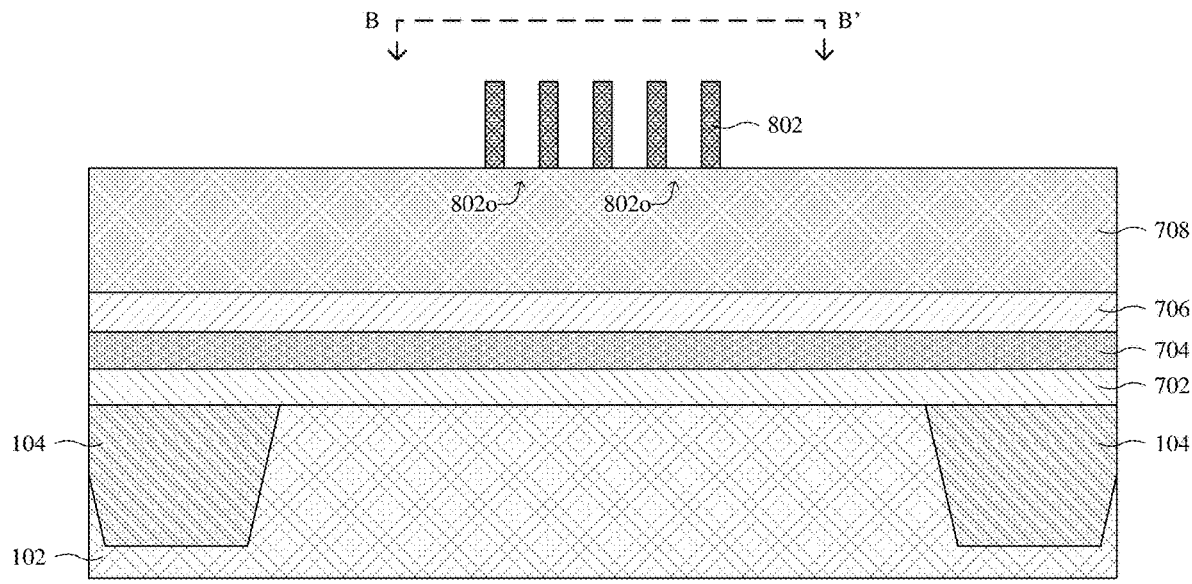
Figure 8B:
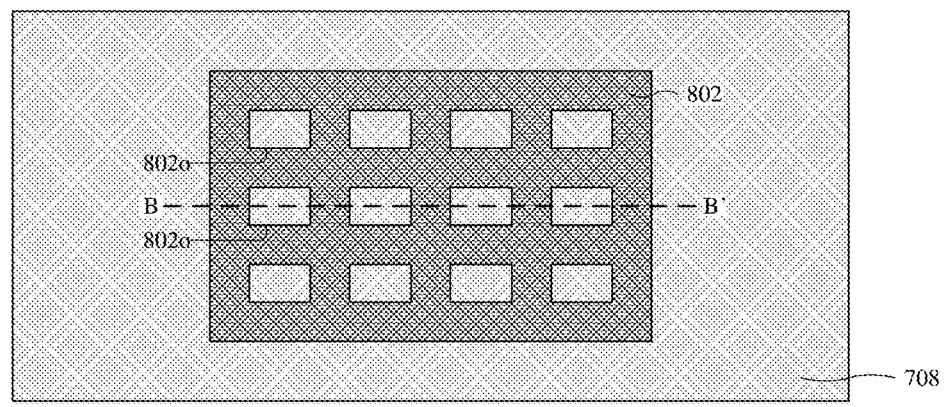

As illustrated in the cross-sectional view 800a of FIG. 8A and the top view 800b of FIG. 8B, the masking layer (710 of FIG. 7) is patterned, thereby forming a patterned masking layer 802 over the grid layer 708. In some embodiments, forming the patterned masking layer 802 may include patterning the masking layer (710 of FIG. 7) to a pattern (e.g., via a lithography process, such as photolithography, extreme ultraviolet lithography, or the like), and developing the masking layer (710 of FIG. 7) to form the patterned masking layer 802. In some embodiments, the patterned masking layer 802 comprises a plurality of sidewalls defining a plurality of openings 802o, such that the patterned masking layer 802 comprises a grid structure as illustrated in FIGS. 8A and 8B.

Figure 9A:
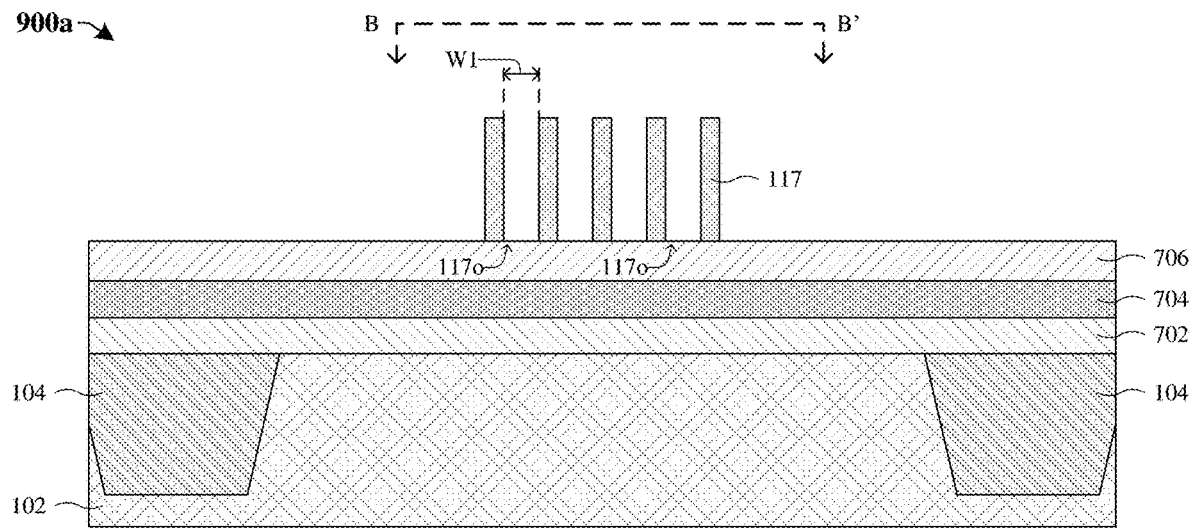
Figure 9B:
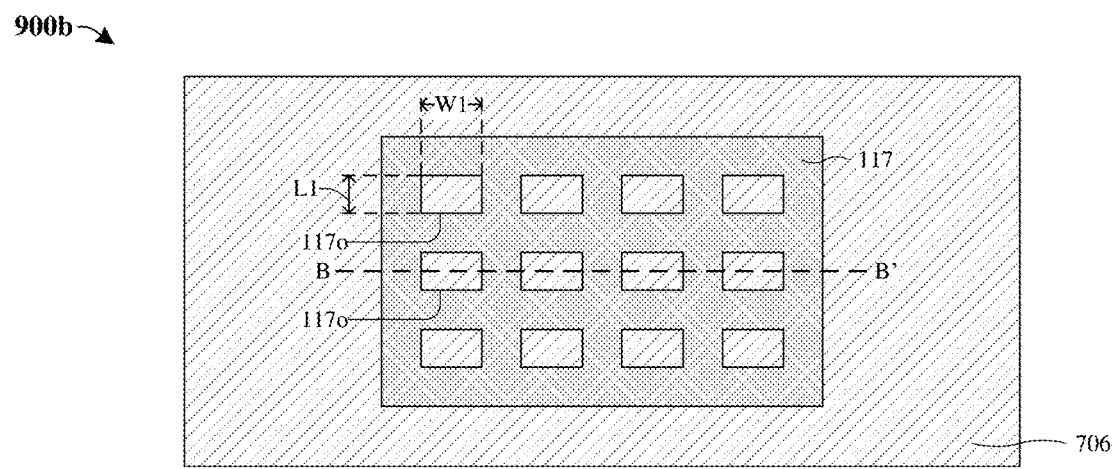

As illustrated in the cross-sectional view 900a of FIG. 9A and the top view 900b of FIG. 9B, the grid layer (708 of FIGS. 8A and 8B) is patterned according to the patterned masking layer (802 of FIGS. 8A-8B), thereby forming the grid structure 117. In some embodiments, the patterning process includes performing a wet etch process and/or a dry etch process on the grid layer (708 of FIGS. 8A and 8B). Further, the grid structure 117 is formed in such a manner that it comprises a plurality of sidewalls defining a plurality of openings 117o. The openings 117o respectively have a width W1 and a length L1. In some embodiments, the openings 117o are formed such that the width W1 and the length L1 are respectively less than about 20 nanometers, within a range of about 1 to 20 nanometers, or another suitable value.

In yet further embodiments, various patterning techniques can be used, in place of the steps illustrated in FIGS. 8A-8B through 9A-9B, to achieve a dense grid structure 117 patterning. For example, formation of the grid structure 117 may include performing self-aligned double patterning (SADP), self-aligned quadruple patterning (SAQP), and/or extreme ultraviolet (EUV) lithography. This, in part, may ensure that the size of the openings 117o respectively have the relatively small width W1 and relatively small length L1.

Figure 10A:
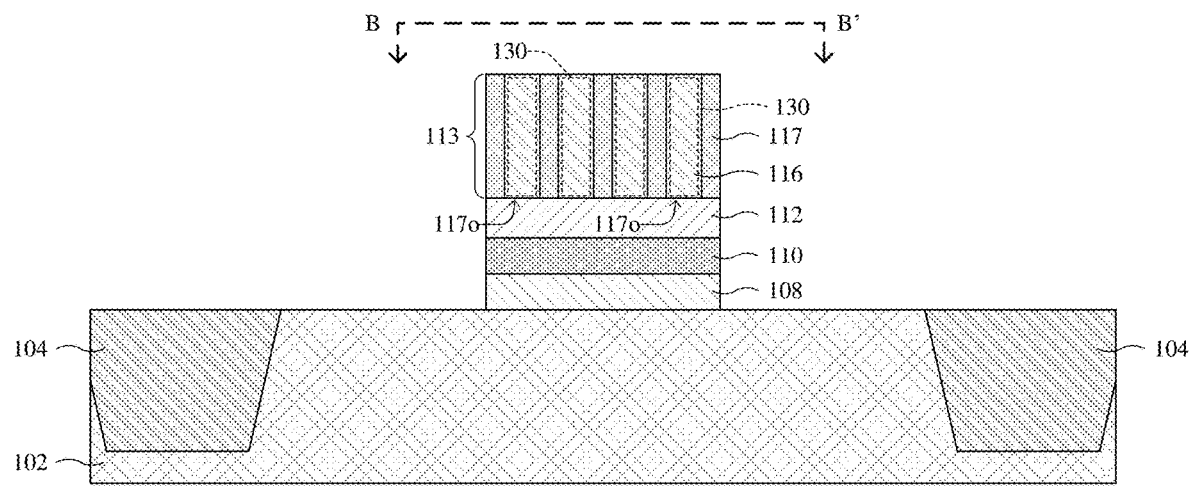
Figure 10B:
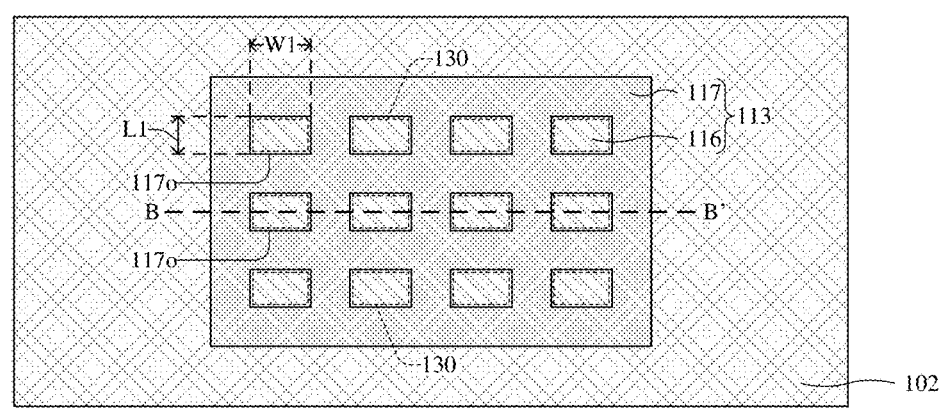

As illustrated in the cross-sectional view 1000a of FIG. 10A and the top view 1000b of FIG. 10B, a ferroelectric layer 116 is formed over the substrate 102, thereby forming a ferroelectric structure 113. In some embodiments, the ferroelectric structure 113 comprises the ferroelectric layer 116 and the grid structure 117. In further embodiments, a process for forming the ferroelectric layer 116 includes depositing (e.g., by CVD, PVD, ALD, etc.) a ferroelectric material over the substrate 102, such that the ferroelectric material fills the openings 117o defined by sidewalls of the grid structure 117. In some embodiments, the ferroelectric material is deposited as a conformal layer such that it overlies regions of the substrate 102 laterally offset from the grid structure 117. Thus, in some embodiments, after depositing the ferroelectric material, a patterning process is performed on the ferroelectric material to remove it from regions laterally offset from the grid structure 117, thereby defining the ferroelectric layer 116. In addition, a planarization process (e.g., a chemical mechanical polishing (CMP) process) may be performed on the ferroelectric layer 116, such that an upper surface of the grid structure 117 and an upper surface of the ferroelectric layer 116 are co-planar. In yet further embodiments, the ferroelectric layer 116 may, for example, be or comprise a metal-oxide (e.g., hafnium oxide ($Hf_xO_y$)), a component-metal-oxide (e.g., hafnium-silicon-oxide ($Hf_xSi_yO_z$), hafnium-aluminum-oxide ($Hf_xAl_yO_z$), hafnium-gadolinium-oxide ($Hf_xGd_yO_z$), hafnium-zirconium-oxide ($Hf_xZr_yO_z$), hafnium-lanthanum-oxide ($Hf_xLa_yO_z$), hafnium-strontium-oxide ($Hf_xSr_yO_z$), hafnium-yttrium-oxide ($Hf_xY_yO_z$), etc.), a metal-oxynitride (e.g., hafnium oxynitride ($Hf_xO_yN_z$)), or the like.

Further, as illustrated in the various views of FIGS. 10A and 10B, a patterning process is performed on the gate dielectric film (702 of FIG. 9A), the gate electrode layer (704 of FIG. 9A), and the first conductive film (706 of FIG. 9A), thereby forming a gate dielectric layer 108, a gate electrode 110, and a first conductive structure 112, respectively. In some embodiments, the aforementioned patterning process includes forming a masking layer (not shown) over the ferroelectric structure 113, and exposing unmasking regions of underlying layers (e.g., the gate dielectric film (702 of FIG. 9A), the gate electrode layer (704 of FIG. 9A), and the first conductive film (706 of FIG. 9A)) to one or more etchants. In yet further embodiments, the gate dielectric film (702 of FIG. 9A), the gate electrode layer (704 of FIG. 9A), and the first conductive film (706 of FIG. 9A) may be patterned concurrently with the ferroelectric material, such that the gate dielectric layer 108, the gate electrode 110, the first conductive structure 112, and the ferroelectric layer 116 are formed concurrently.

Additionally, the ferroelectric layer 116 comprises a plurality of ferroelectric domains 130 disposed within the openings 117o of the grid structure 117. By virtue of the openings 117o having the relatively small width W1 and the length L1, a size of each ferroelectric domain 130 is restricted to the width W1 and the length L1. This, in some embodiments, increases a uniformity in size of the ferroelectric domains 130 across the ferroelectric layer 116.

Figure 11:
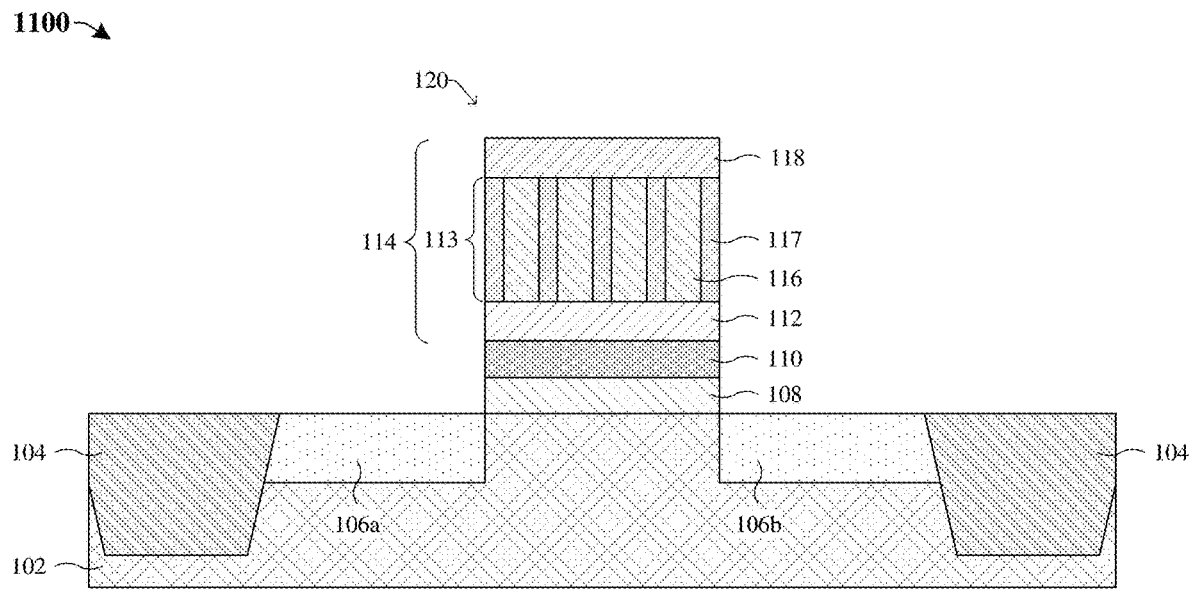

As illustrated in the cross-sectional view 1100 of FIG. 11, a second conductive structure 118 is formed over the ferroelectric structure 113, thereby defining a ferroelectric memory device 114 and a device gate stack 120. In some embodiments, a process for forming the second conductive structure 118 includes: depositing (e.g., by CVD, PVD, sputtering, electroless plating, electro plating, or another suitable deposition or growth process) a conductive layer over the substrate 102; and patterning the conductive layer, thereby defining the second conductive structure 118. In some embodiments, the second conductive structure 118 may, for example, be or comprise a metal (e.g., aluminum, titanium, tantalum, gold, platinum, tungsten, nickel, iridium, etc.), a metal-nitride (e.g., titanium nitride, tantalum nitride, etc.), doped polysilicon (e.g., n-type/p-type polysilicon), another suitable conductive material, or any combination of the foregoing.

Further, as illustrated in FIG. 11, a pair of source/drain regions 106a-b are formed in the substrate 102. The source/drain regions 106a-b are formed on opposite sides of the gate dielectric layer 108. In some embodiments, the source/drain regions 106a-b are formed by an ion implantation process and may utilize a masking layer (not shown) to selectively implant ions into the substrate 102. In further embodiments, the device gate stack 120 may be utilized as the masking layer to form the source/drain regions 106a-b.

Figure 12:
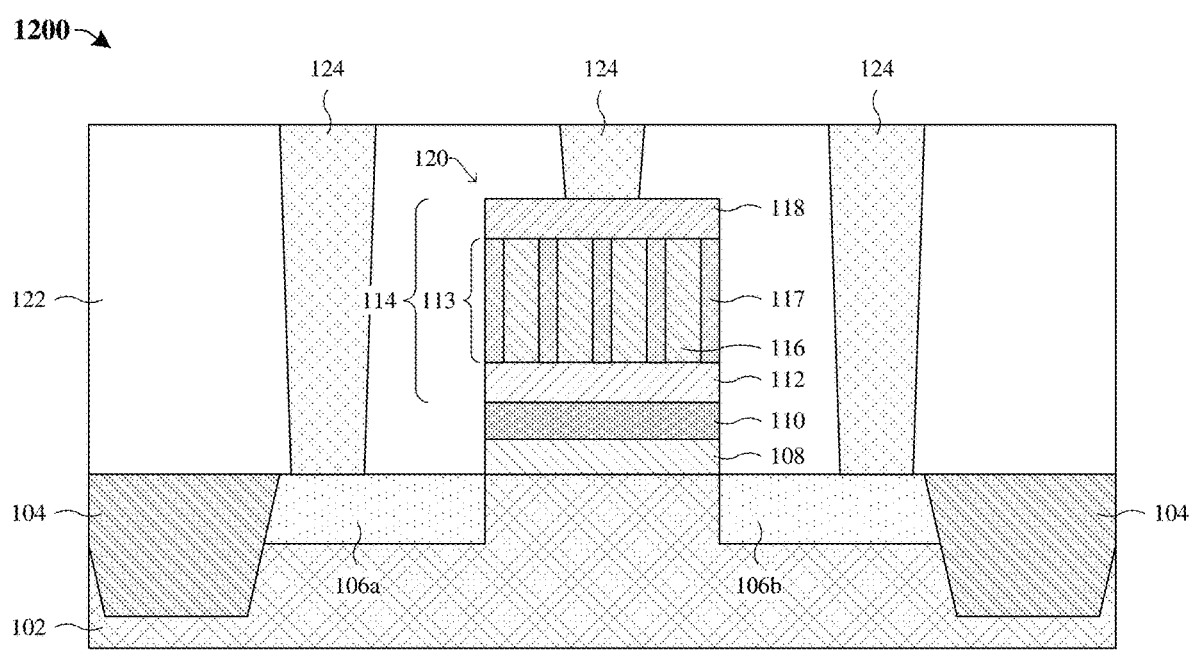

As illustrated in the cross-sectional view 1200 of FIG. 12, an inter-level dielectric (ILD) structure 122 is formed over the substrate 102. In some embodiments, the ILD structure 122 may be formed by, for example, CVD, PVD, ALD, or another suitable deposition or growth process. Further, a plurality of conductive contacts 124 are formed over the substrate 102 and within the ILD structure 122. In some embodiments, the conductive contacts 124 may be formed by a single damascene process or another suitable process. In some embodiments, the ILD structure 122 may, for example, be or comprise an oxide (e.g., silicon dioxide), a low-k dielectric material, an extreme low-k dielectric material, another suitable dielectric material, or any combination of the foregoing. In further embodiments, the conductive contacts 124 may, for example, be or comprise aluminum, copper, tungsten, titanium nitride, tantalum nitride, another suitable conductive material, or any combination of the foregoing.

Figure 13:
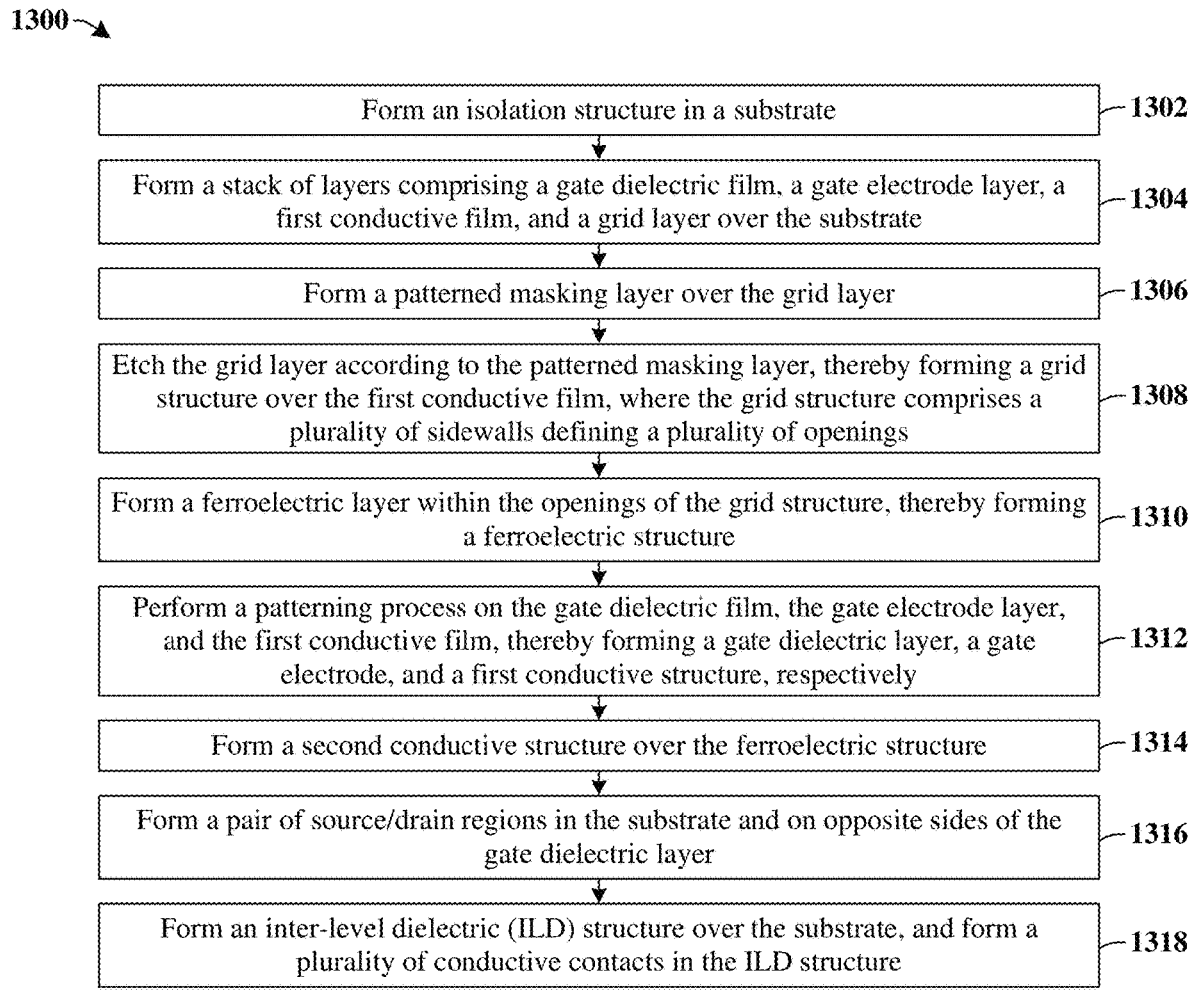
FIG. 13 illustrates a flowchart of some embodiments of a method for forming an integrated chip comprising a front-end-of-line ferroelectric memory device having a ferroelectric layer disposed within a grid structure.

FIG. 13 illustrates a flowchart 1300 of some embodiments of a method for forming an integrated chip having a ferroelectric memory device with a ferroelectric structure that includes a ferroelectric layer disposed within a grid structure in accordance with some embodiments of the present disclosure. Although the flowchart 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1302, an isolation structure is formed within a substrate. FIG. 6 illustrates a cross-sectional view 600 corresponding to some embodiments of act 1302.

At act 1304, a stack of layers is formed over the substrate, where the stack of layers include a gate dielectric film, a gate electrode layer, a first conductive film, and a grid layer. FIG.

7 illustrates a cross-sectional view 700 corresponding to some embodiments of act 1304.

At act 1306, a patterned masking layer is formed over the grid layer. FIGS. 7 through 8A-8B illustrate various views corresponding to some embodiments of act 1306.

At act 1308, the grid layer is etched according to the patterned masking layer, thereby forming a grid structure over the first conductive film. The grid structure comprises a plurality of sidewalls defining a plurality of openings. FIGS. 9A-9B illustrate various views corresponding to some embodiments of act 1308.

At act 1310, a ferroelectric layer is formed within the openings of the grid structure, thereby forming a ferroelectric structure. FIGS. 10A-10B illustrate various views corresponding to some embodiments of act 1310.

At act 1312, a patterning process is performed on the gate dielectric film, the gate electrode layer, and the first conductive film, thereby forming a gate dielectric layer, a gate electrode, and a first conductive structure, respectively. FIGS. 10A-10B illustrate various views corresponding to some embodiments of act 1312.

At act 1314, a second conductive structure is formed over the ferroelectric structure. FIG. 11 illustrates a cross-sectional view 1100 corresponding to some embodiments of act 1314.

At act 1316, a pair of source/drain regions are formed in the substrate and on opposite sides of the gate dielectric layer. FIG. 11 illustrates a cross-sectional view 1100 corresponding to some embodiments of act 1316.

At act 1318, an inter-level dielectric (ILD) structure is formed over the substrate, and a plurality of conductive contacts are formed within the ILD structure. FIG. 12 illustrates a cross-sectional view 1200 corresponding to some embodiments of act 1318.

Figure 14:
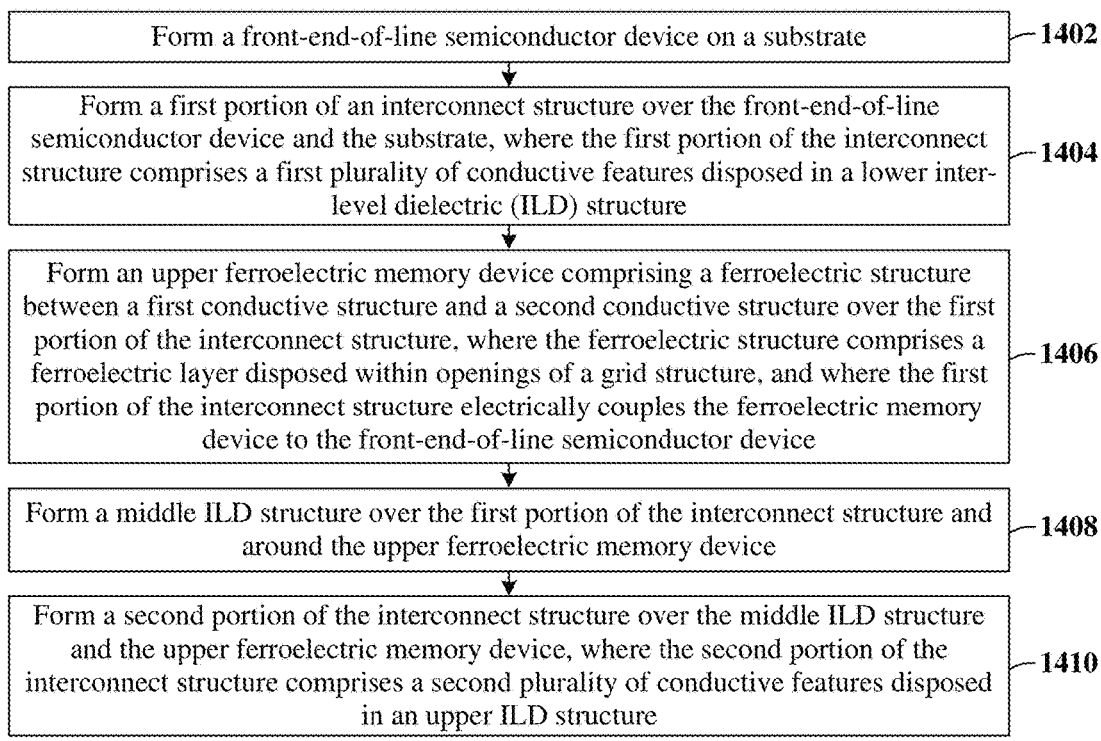
FIG. 14 illustrates a flowchart of some embodiments of a method for forming an integrated chip comprising a back-end-of-line ferroelectric memory device having a ferroelectric layer disposed within a grid structure.

FIG. 14 illustrates a flowchart 1400 of some embodiments of a method for forming an integrated chip having a back-end-of-line ferroelectric memory device that includes a ferroelectric layer disposed within a grid structure. In some embodiments, the back-end-of-line ferroelectric memory device may be the upper ferroelectric memory device 503 of FIG. 5. Although the flowchart 1400 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1402, a front-end-of-line semiconductor device is formed on a substrate.

In some embodiments, the front-end-of-line semiconductor device may, for example, be a metal-oxide semiconductor field-effect transistor (MOSFET), a bipolar junction transistor (BJT), high-electron-mobility transistor (HEMT), or any other front-end-of-line semiconductor device. In some embodiments, the front-end-of-line semiconductor device may be formed by process(es) substantially similar to process(es) described above regarding formation of the structure of the cross-sectional view 1200 of FIG. 12 (see, e.g., FIGS. 6-12). For example, the process(es) to form the isolation structure 104, the gate dielectric layer 108, the gate electrode 110, and/or the source/drain regions 106*a-b*.

At act 1404, a first portion of an interconnect structure is formed over the front-end-of-line semiconductor device and the substrate, where the first portion of the interconnect structure comprises a first plurality of conductive features disposed in a lower inter-level dielectric (ILD) structure.

In some embodiments, the first plurality of conductive features may be substantially similar to one or more of the plurality of conductive contacts 124, the plurality of conductive lines 302, and/or the plurality of conductive vias 304 disposed in the lower ILD structure 502 (e.g., see FIG. 5). In further embodiments, the lower ILD structure may be substantially similar to the lower ILD structure 502 of FIG. 5. In yet further embodiments, the lower ILD structure may be deposited by CVD, PVD, ALD, or another suitable growth or deposition process. In various embodiments, the first plurality of conductive features may be formed by a single damascene process or a dual damascene process.

At act 1406, an upper ferroelectric memory device comprising a ferroelectric structure between a first conductive structure and a second conductive structure is formed over the first portion of the interconnect structure. The ferroelectric structure comprises a ferroelectric layer disposed within openings of a grid structure. Further, the first portion of the interconnect structure electrically couples the ferroelectric memory device to the front-end-of-line semiconductor device.

In some embodiments, the upper ferroelectric memory device may be formed over the first portion of the interconnect structure by process(es) substantially similar to process(es) described above regarding formation of the ferroelectric memory device 114 (see, e.g., FIGS. 7-11). For example, the process(es) to form the first conductive structure 112, the ferroelectric structure 113, and/or the second conductive structure 118.

At act 1408, a middle ILD structure is formed over the first portion of the interconnect structure and around the upper ferroelectric memory device.

In some embodiments, the middle ILD structure may be substantially similar to the middle ILD structure 504 of FIG. 5. In further embodiments, the middle ILD structure may be deposited by CVD, PVD, ALD, or another suitable growth or deposition process.

At act 1410, a second portion of the interconnect structure is formed over the middle ILD structure and the upper ferroelectric memory device. The second portion of the interconnect structure comprises a second plurality of conductive features disposed in an upper ILD structure.

In some embodiments, the second plurality of conductive features may be substantially similar to one or more of the plurality of conductive lines 302 and/or the plurality of conductive vias 304 disposed in the upper ILD structure 506 (e.g., see FIG. 5). In further embodiments, the upper ILD structure may be substantially similar to the upper ILD structure 506 of FIG. 5. In yet further embodiments, the upper ILD structure may be deposited by CVD, PVD, ALD, or another suitable growth or deposition process. In various embodiments, the second plurality of conductive features may be formed by a single damascene process or a dual damascene process.

Accordingly, in some embodiments, the present disclosure relates to integrated chip having a ferroelectric memory device with a ferroelectric structure that includes a ferroelectric layer and a grid structure. The grid structure comprises a plurality of sidewalls defining a plurality of openings, in which the ferroelectric layer is disposed within the plurality of openings.

In some embodiments, the present application provides an integrated chip, including: a pair of source/drain regions disposed in a substrate; a gate dielectric layer disposed over the substrate and laterally between the pair of source/drain regions; and a ferroelectric structure overlying the gate dielectric layer, wherein the ferroelectric structure comprises a ferroelectric layer and a grid structure, wherein the ferroelectric layer comprises a plurality of segments laterally offset from one another, and wherein the grid structure laterally encloses each segment of the ferroelectric layer.

In further embodiments, the present application provides an integrated chip, including: a semiconductor device disposed on a substrate; a first inter-level dielectric (ILD) structure overlying the semiconductor device and the substrate; and a polarization switching structure overlying the first ILD structure and electrically coupled to the semiconductor device, wherein the polarization switching structure includes a ferroelectric structure disposed between a first conductive structure and a second conductive structure, wherein the ferroelectric structure includes a ferroelectric layer and a grid structure, wherein the grid structure laterally encloses an outer perimeter of the ferroelectric layer, wherein the ferroelectric layer comprises a first material and the grid structure comprises a second material different than the first material.

In yet further embodiments, the present application provides a method for forming a ferroelectric memory device, the method includes: forming a dielectric layer over a substrate; depositing a grid layer over the dielectric layer, wherein the grid layer comprises a first material; forming a patterned masking layer over the grid layer; etching the grid layer according to the patterned masking layer, thereby forming a grid structure, wherein the grid structure comprises a plurality of sidewalls defining a plurality of openings; forming a ferroelectric layer over the substrate such that the ferroelectric layer fills the plurality of openings, wherein the ferroelectric layer comprises a second material different from the first material; and forming an upper conductive structure over the grid structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:
depositing a grid layer over a substrate;
patterning the grid layer to form a grid structure, wherein the grid structure comprises a plurality of sidewalls defining a plurality of openings;
depositing a ferroelectric layer over the substrate, wherein the ferroelectric layer fills the plurality of openings and is disposed along the plurality of sidewalls of the grid structure; and
forming an upper conductive structure over the grid structure.

2. The method of claim 1, further comprising:
forming a lower dielectric structure over the substrate; and
forming a lower conductive structure between the lower dielectric structure and the grid structure, wherein sidewalls of the lower conductive structure are aligned with sidewall of the grid structure.

3. The method of claim 1, wherein a height of the grid structure is equal to a height of the ferroelectric layer.

4. The method of claim 1, wherein the grid structure is formed before depositing the ferroelectric layer, wherein the ferroelectric layer comprises a plurality of ferroelectric segments disposed within the plurality of openings, wherein a width of an individual ferroelectric segment in the plurality of ferroelectric segments is equal to a width of a corresponding opening in the plurality of openings.

5. The method of claim 1, wherein patterning the grid layer comprises performing a self-aligned double patterning process, a self-aligned quadruple patterning process, and/or an extreme ultraviolet lithography process.

6. The method of claim 1, wherein the grid layer comprises a first material and the ferroelectric layer comprises a second material different from the first material.

7. The method of claim 1, further comprising:
performing a patterning process on the ferroelectric layer to remove the ferroelectric layer from over the substrate in regions laterally offset from outer sidewalls of the grid structure.

8. The method of claim 1, further comprising:
performing a planarization process on the ferroelectric layer, wherein a top surface of the ferroelectric layer is co-planar with a top surface of the grid structure.

9. The method of claim 1, further comprising:
forming a gate dielectric layer between the grid layer and the substrate; and
performing a doping process on the substrate to form a pair of source/drain regions within the substrate on opposing sides of the grid structure, wherein the doping process is performed after depositing the ferroelectric layer.

10. A method for forming an integrated chip, comprising:
forming a dielectric layer over a substrate;
forming a grid structure over the dielectric layer, wherein the grid structure comprises a plurality of elongated grid segments extending in a first direction and a plurality of short grid segments extending in a second direction between the elongated grid segments, wherein the first direction is orthogonal to the second direction; and
forming a ferroelectric layer laterally between the plurality of elongated grid segments and the plurality of short grid segments.

11. The method of claim 10, wherein the grid structure comprises a first dielectric material and the ferroelectric layer comprises a second dielectric material different from the first dielectric material.

12. The method of claim 10, wherein the ferroelectric layer comprises a plurality of ferroelectric segments disposed between adjacent grid segments in the plurality of elongated grid segments, wherein a width of an individual ferroelectric segment in the plurality of ferroelectric segments is greater than a width of an individual elongated grid segment in the plurality of elongated grid segments.

13. The method of claim 12, wherein a length of the individual elongated grid segment is greater than a length of the ferroelectric layer.

14. The method of claim 10, wherein the grid structure continuously wraps around an outer perimeter of the ferroelectric layer along an unbroken path.

15. The method of claim 10, further comprising:
forming a first conductive structure below the grid structure; and forming a second conductive structure over the grid structure, wherein sidewalls of the first conductive structure, sidewalls of the grid structure, and sidewalls of the second conductive structure are aligned.

16. The method of claim 15, further comprising:
forming a semiconductor device on the substrate; and
forming a lower interconnect structure between the semiconductor device and the first conductive structure, wherein the lower interconnect structure electrically couples the semiconductor device to the first conductive structure.

17. A method for forming a ferroelectric memory device, the method comprising:
forming a dielectric layer over a substrate;
depositing a grid layer over the dielectric layer, wherein the grid layer comprises a first material;
forming a patterned masking layer over the grid layer;
etching the grid layer according to the patterned masking layer, thereby forming a grid structure, wherein the grid structure comprises a plurality of sidewalls defining a plurality of openings;
forming a ferroelectric layer over the substrate such that the ferroelectric layer fills the plurality of openings, wherein the ferroelectric layer comprises a second material different from the first material; and
forming an upper conductive structure over the grid structure.

18. The method of claim 17, further comprising:
forming a gate electrode over the dielectric layer such that the gate electrode is between the grid structure and the dielectric layer; and
forming a lower conductive structure between the gate electrode and the grid structure.

19. The method of claim 18, further comprising:
forming a pair of source/drain regions within the substrate and on opposing sides of the dielectric layer.

20. The method of claim 17, wherein the grid structure is formed such that it comprises a plurality of grid pillar structures with a first width, and the ferroelectric layer is formed such that is comprises a plurality of ferroelectric pillar structures with a second width greater than the first width, wherein the ferroelectric pillar structures are disposed between adjacent pairs of the grid pillar structures.

* * * * *